United States Patent
Osuga et al.

(10) Patent No.: US 9,532,444 B2
(45) Date of Patent: Dec. 27, 2016

(54) METHOD OF MANUFACTURING PRINTED WIRING BOARD, AND PRINTED WIRING BOARD

(75) Inventors: Hiroyuki Osuga, Chiyoda-ku (JP);
Sohei Samejima, Chiyoda-ku (JP);
Kazuhito Sakurada, Minami-alps (JP);
Akira Yagasaki, Minami-alps (JP);
Tatsuya Hinata, Minami-alps (JP)

(73) Assignees: Mitsubishi Electric Corporation, Tokyo (JP); NIPPON AVIONICS CO., LTD., Tokyo (JP)

( * ) Notice: Subject to any disclaimer, the term of this patent is extended or adjusted under 35 U.S.C. 154(b) by 496 days.

(21) Appl. No.: 13/520,812

(22) PCT Filed: Feb. 23, 2011

(86) PCT No.: PCT/JP2011/054015
§ 371 (c)(1),
(2), (4) Date: Jul. 6, 2012

(87) PCT Pub. No.: WO2011/105440
PCT Pub. Date: Sep. 1, 2011

(65) Prior Publication Data
US 2013/0008700 A1  Jan. 10, 2013

(30) Foreign Application Priority Data

Feb. 26, 2010 (JP) .................. 2010-042906

(51) Int. Cl.
*H05K 1/16* (2006.01)
*H05K 1/02* (2006.01)
*H05K 3/46* (2006.01)

(52) U.S. Cl.
CPC ........... *H05K 1/0243* (2013.01); *H05K 3/4611* (2013.01); *H05K 2201/0187* (2013.01); *H05K 2201/0323* (2013.01)

(58) Field of Classification Search
CPC ............ H01L 2924/01079; H01L 2924/01078; H05K 1/021; H05K 1/0212; H05K 1/0215; H05K 1/023; H05K 1/0231; H05K 1/0233; H05K 1/0234; H05K 1/0243; H05K 1/0295; H05K 1/14; H05K 1/141; H05K 1/142; H05K 1/144; H05K 1/145; H05K 1/16; H05K 1/162; H05K 1/165; H05K 1/167; H05K 1/18; H05K 1/181; H05K 1/182; H05K 1/183; H05K 1/184; H05K 1/185; H05K 2201/0317; H05K 2201/041; H05K 2201/049; H05K 2201/09763; H05K 2201/09872; H05K 2201/10446; H05K 2201/10454; H05K 2201/10462; H05K 2201/104; H05K 3/46; H05K 2201/0187; H05K 2201/0323
(Continued)

(56) References Cited

U.S. PATENT DOCUMENTS 6,809,268 B2 * 10/2004 Hayashi ............ H01L 23/49894
174/260
7,627,947 B2 * 12/2009 Davis ..................... H05K 3/429
174/261
(Continued)

FOREIGN PATENT DOCUMENTS

CN 1771771 A 5/2006
CN 101278392 A 10/2008
(Continued)

OTHER PUBLICATIONS

European Search Report issued Sep. 4, 2013 in Patent Application No. 11747400.7.
(Continued)

*Primary Examiner* — Jenny L Wagner
*Assistant Examiner* — Pete Lee
(74) *Attorney, Agent, or Firm* — Oblon, McClelland, Maier & Neustadt, L.L.P.

(57) ABSTRACT

On a printed wiring board obtained by a method of manufacturing a printed board, a predetermined component is to be mounted on at least one of a front surface side and a back surface side. The manufacturing method includes preparing a CFRP core, forming a through hole so as to penetrate the CFRP core from the front surface side to the back surface side and include a region in which the component is to be mounted when viewed in a plan view, and embedding a GFRP core having insulating properties within the through hole by filling the through hole with a resin having insulating properties and curing the resin. According to the manufacturing method, the component mounted on the printed board is not affected by a stray capacitance due to a CFRP, and it is not difficult to form a circuit.

5 Claims, 15 Drawing Sheets

(58) Field of Classification Search
USPC .. 174/260–262; 361/760, 792, 795; 438/637
See application file for complete search history.

(56) References Cited

U.S. PATENT DOCUMENTS

| | | | |
|---|---|---|---|
| 8,110,749 B2* | 2/2012 | Yoshimura | H05K 3/445 174/260 |
| 2004/0040738 A1 | 3/2004 | Tani et al. | |
| 2004/0151882 A1 | 8/2004 | Tani et al. | |
| 2006/0244134 A1 | 11/2006 | Inagaki et al. | |
| 2007/0013390 A1 | 1/2007 | Kuitani et al. | |
| 2007/0215381 A1 | 9/2007 | Vasoya | |
| 2008/0047742 A1* | 2/2008 | Samejima et al. | 174/257 |
| 2009/0000812 A1 | 1/2009 | Kariya | |
| 2009/0084590 A1 | 4/2009 | Yoshimura et al. | |
| 2009/0107702 A1* | 4/2009 | Samejima et al. | 174/254 |
| 2010/0288544 A1 | 11/2010 | Kariya | |
| 2010/0321914 A1 | 12/2010 | Inagaki et al. | |
| 2010/0326716 A1* | 12/2010 | Zhang et al. | 174/262 |
| 2011/0290408 A1 | 12/2011 | Samejima et al. | |

FOREIGN PATENT DOCUMENTS

| | | |
|---|---|---|
| JP | 11 40902 | 2/1999 |
| JP | 2004 119691 | 4/2004 |
| JP | 2004-311849 | 11/2004 |
| JP | 2007 19157 | 1/2007 |
| JP | 2007-288055 A | 11/2007 |
| JP | 2008 53362 | 3/2008 |
| JP | 2009 88173 | 4/2009 |
| JP | 2009 135415 | 6/2009 |
| JP | 2009 302459 | 12/2009 |

OTHER PUBLICATIONS

Chinese Office Action issued Jul. 3, 2014, in China Patent Application No. 201180011094.7 (with Partial English translation).
Japanese Office Action issued Mar. 4, 2014, in Japan Patent Application 2013-165311 (with English translation).
International Search Report Issued May 31, 2011 in PCT/JP11/54015 Filed Feb. 23, 2011.

* cited by examiner (A)

(B)

(A)

(B)

METHOD OF MANUFACTURING PRINTED WIRING BOARD, AND PRINTED WIRING BOARD

TECHNICAL FIELD

The present invention relates to a method of manufacturing a printed wiring board, and the printed wiring board, and in particular to a method of manufacturing a printed wiring board having a core containing a carbon fiber reinforced plastic, and the printed wiring board.

BACKGROUND ART

In recent years, it has become desirable for printed wiring boards to include a substrate with good heat dissipation properties, as electronic components are mounted in higher density. A metal core substrate has been known as a printed wiring board excellent in heat dissipation properties, and has already been put to practical use. The metal core substrate uses a metal having high thermal conductivity as a core material, and thereby can dissipate heat from a heat-generating component throughout the printed wiring board and suppress an increase in the temperature of the heat-generating component. Above all, aluminum, which has a low specific gravity, is generally used as a core material.

However, aluminum has a high thermal expansion coefficient of about 24 ppm/K, whereas a ceramic component has a low thermal expansion coefficient of about 7 ppm/K. Therefore, there arises a problem that when a heat cycle test is conducted, a crack occurs at a solder joint portion due to a difference in thermal expansion coefficient between aluminum and the ceramic component, failing to achieve mounting reliability.

As a core material capable of solving the above problem, carbon fiber reinforced plastics (hereinafter also referred to as CFRPs) have been known (for example, see Japanese Patent Laying-Open No. 11-40902 (Patent Literature 1)). A CFRP is a composite material made of carbon fiber and a resin. The carbon fiber has a low thermal expansion coefficient of ±2 ppm/K. Some of carbon fibers have a thermal conductivity of not less than 500 $Wm^{-1}K^{-1}$. In addition, the carbon fiber has a low specific gravity of about 2 $g/cm^3$. If a core substrate can be fabricated using a CFRP, a substrate with high thermal conductivity and more excellent in mounting reliability than aluminum can be obtained. The CFRP has an in-plane thermal expansion coefficient of about 0 ppm/K, and an out-of-plane thermal expansion coefficient of about 30 ppm/K.

Since the CFRP is electrically conductive, the CFRP is insulated from a penetrating through hole for connecting wirings above and below a core. After the CFRP is insulated from the penetrating through hole, a predetermined circuit is formed on at least one of a front surface and a back surface of the core. After the circuit is formed, a predetermined component is mounted.

CITATION LIST

Patent Literature

PTL 1: Japanese Patent Laying-Open No. 11-40902

SUMMARY OF INVENTION

Technical Problem

Some components to be mounted on the core may be affected by a stray capacitance due to the CFRP. To avoid influence of the stray capacitance, it is necessary to remove a portion of the CFRP which includes a region in which a component is to be mounted when viewed in a plan view. However, as a result of removing the CFRP, the core has an uneven front surface (or back surface). A printed wiring board also has an uneven front surface (or back surface), and thus it becomes difficult to form a circuit.

A first object of the present invention is to provide a method of manufacturing a printed wiring board in which a mounted component is not affected by a stray capacitance due to a CFRP, and in which it is not difficult to form a circuit, and the printed wiring board. Further, another object of the present invention is to provide a method of manufacturing a printed wiring board in which a component-mounting surface in a front surface or a back surface of the printed wiring board at a portion from which the CFRP is removed does not become uneven, and the printed wiring board.

Generally, after a circuit is formed on a core, an outer edge of the core is cut to obtain a printed wiring board having a predetermined size. When the outer edge of the core is cut, a CFRP is exposed at side surfaces of the core. The CFRP includes carbon fiber, and carbon powder is scattered from the exposed CFRP. Since the carbon powder is electrically conductive, if it adheres between fine wirings on the circuit, it may cause a short circuit or the like.

A second object of the present invention is to provide a method of manufacturing a printed wiring board in which a CFRP is not exposed at side surfaces of a core even if an outer edge of the core is cut after a circuit is formed on the core, and the printed wiring board.

Solution to Problem

A method of manufacturing a printed wiring board in accordance with a first aspect of the present invention is a method of manufacturing a printed wiring board on which a predetermined component is to be mounted on at least one of a front surface side and a back surface side, including the following steps: preparing a core containing a carbon fiber reinforced plastic; forming a first through hole so as to penetrate the core from the front surface side to the back surface side and include a region in which the component is to be mounted when viewed in a plan view; closing the back surface side of the first through hole; arranging a fiber reinforced plastic having insulating properties so as to be included in the first through hole; and embedding the fiber reinforced plastic within the first through hole by filling the first through hole with a resin having insulating properties and curing the resin.

A printed wiring board in accordance with a second aspect of the present invention is a printed wiring board having a mounting surface on which a predetermined component is to be mounted on at least one of a front surface side and a back surface side, including: a core containing a carbon fiber reinforced plastic; a fiber reinforced plastic having insulating properties embedded so as to include a region in which the component is to be mounted when viewed in a plan view, and penetrate the core from the front surface side to the back surface side; a resin containing an inorganic filler formed between the region and the fiber reinforced plastic; and an insulating layer laminated on at least one of a front surface side and a back surface side of the core, and provided with the mounting surface or a predetermined wiring pattern.

A method of manufacturing a printed wiring board in accordance with a third aspect of the present invention is a method of manufacturing a printed wiring board, including the following steps: preparing a core having a front surface and a back surface and containing a carbon fiber reinforced plastic; forming a first through hole penetrating the core from a side having the front surface to a side having the back surface; filling the first through hole with a resin containing an inorganic filler; forming a second through hole which defines, together with the first through hole, an outer edge of a region to serve as the printed wiring board, by penetrating the core from the side having the front surface to the side having the back surface and partially overlapping the first through hole when viewed in a plan view; filling the second through hole with another resin containing an inorganic filler; and cutting the core along the outer edge defined by the first through hole and the second through hole.

Advantageous Effects of Invention

According to the method of manufacturing a printed wiring board in accordance with the first aspect of the present invention and the printed wiring board in accordance with the second aspect of the present invention, it is possible to obtain a method of manufacturing a printed wiring board in which a mounted component is not affected by a stray capacitance due to a CFRP, and in which it is not difficult to form a circuit, and the printed wiring board.

Further, according to the method of manufacturing a printed wiring board in accordance with the first aspect of the present invention and the printed wiring board in accordance with the second aspect of the present invention, it is possible to obtain a method of manufacturing a printed wiring board in which a component-mounting surface in a front surface or a back surface of the printed wiring board at a portion from which the CFRP is removed does not become uneven, and the printed wiring board.

According to the method of manufacturing a printed wiring board in accordance with the third aspect of the present invention, it is possible to obtain a method of manufacturing a printed wiring board in which a CFRP is not exposed at side surfaces of a core even if an outer edge of the core is cut after a circuit is formed on the core.

BRIEF DESCRIPTION OF DRAWINGS

FIG. 1 is a view showing a first step of a method of manufacturing a printed wiring board in an embodiment, in which FIG. 1(A) is a plan view thereof, and FIG. 1(B) is a cross sectional view taken along a line I(B)-I(B) in FIG. 1(A) and viewed in the direction of arrows.

FIG. 2 is a view showing a second step of the method of manufacturing the printed wiring board in the embodiment, in which FIG. 2(A) is a plan view thereof, and FIG. 2(B) is a cross sectional view taken along a line II(B)-II(B) in FIG. 2(A) and viewed in the direction of arrows.

FIG. 3 is a view showing a third step of the method of manufacturing the printed wiring board in the embodiment, in which FIG. 3(A) is a plan view thereof, and FIG. 3(B) is a cross sectional view taken along a line III(B)-III(B) in FIG. 3(A) and viewed in the direction of arrows.

FIG. 7 is a view showing a seventh step of the method of manufacturing the printed wiring board in the embodiment, in which FIG. 7(A) is a plan view thereof, and FIG. 7(B) is a cross sectional view taken along a line VII(B)-VII(B) in FIG. 7(A) and viewed in the direction of arrows.

FIG. 10 is a view showing a tenth step of the method of manufacturing the printed wiring board in the embodiment, in which FIG. 10(A) is a plan view thereof, and FIG. 10(B) is a cross sectional view taken along a line X(B)-X(B) in FIG. 10(A) and viewed in the direction of arrows.

FIG. 16 is a view showing a sixteenth step of the method of manufacturing the printed wiring board in the embodiment, in which FIG. 16(A) is a plan view thereof, FIG. 16(B) is a cross sectional view taken along a line XVI(B)-XVI(B) in FIG. 16(A) and viewed in the direction of arrows, and FIG. 16(C) is a cross sectional view taken along a line XVI(C)-XVI(C) in FIG. 16(A) and viewed in the direction of arrows.

FIG. 22 is a view showing a twenty-second step of the method of manufacturing the printed wiring board in the embodiment, in which FIG. 22(A) is a plan view thereof, FIG. 22(B) is a cross sectional view taken along a line XXII(B)-XXII(B) in FIG. 22(A) and viewed in the direction of arrows, and FIG. 22(C) is a cross sectional view taken along a line XXII(C)-XXII(C) in FIG. 22(A) and viewed in the direction of arrows.

FIG. 23 is a view showing a twenty-third step of the method of manufacturing the printed wiring board in the embodiment, in which FIG. 23(A) is a plan view thereof, and FIG. 23(B) is a cross sectional view taken along a line XXIII(B)-XXIII(B) in FIG. 23(A) and viewed in the direction of arrows.

DESCRIPTION OF EMBODIMENTS

Figure 1:
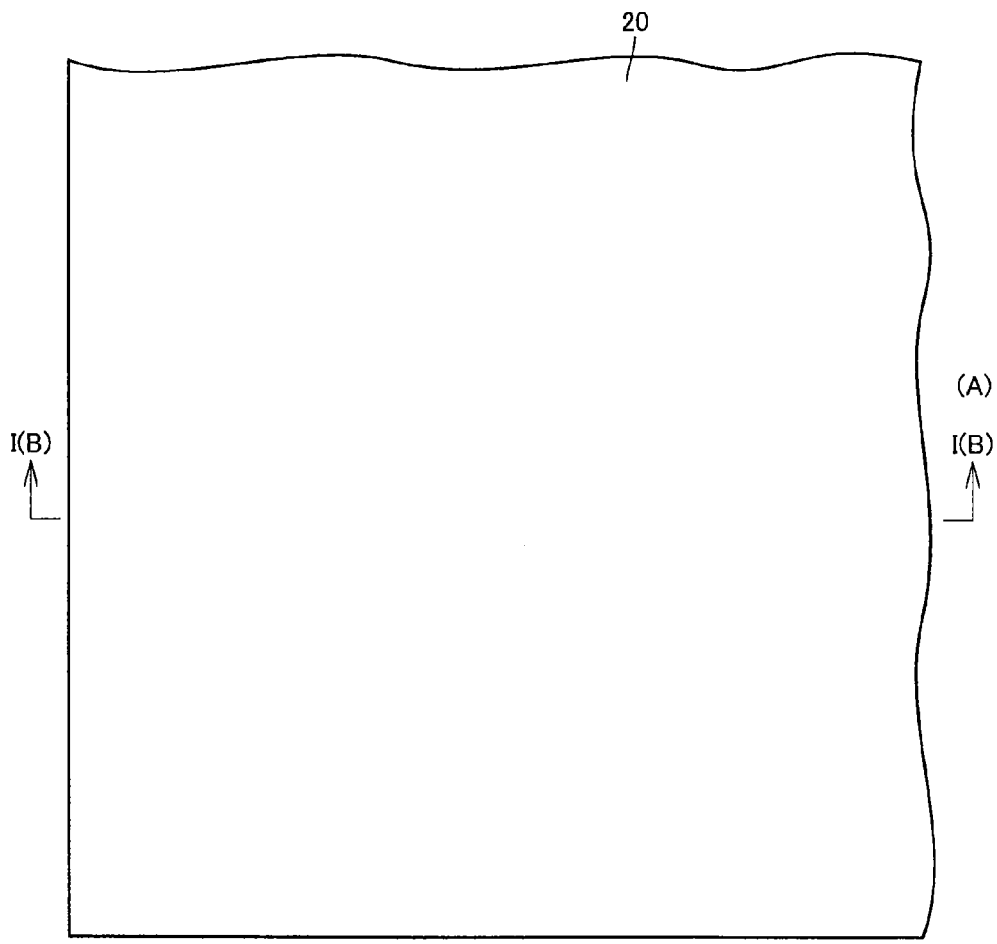
Figure 1:
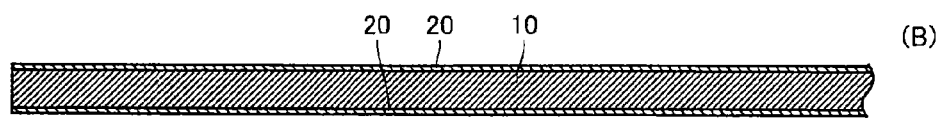
Figure 2:
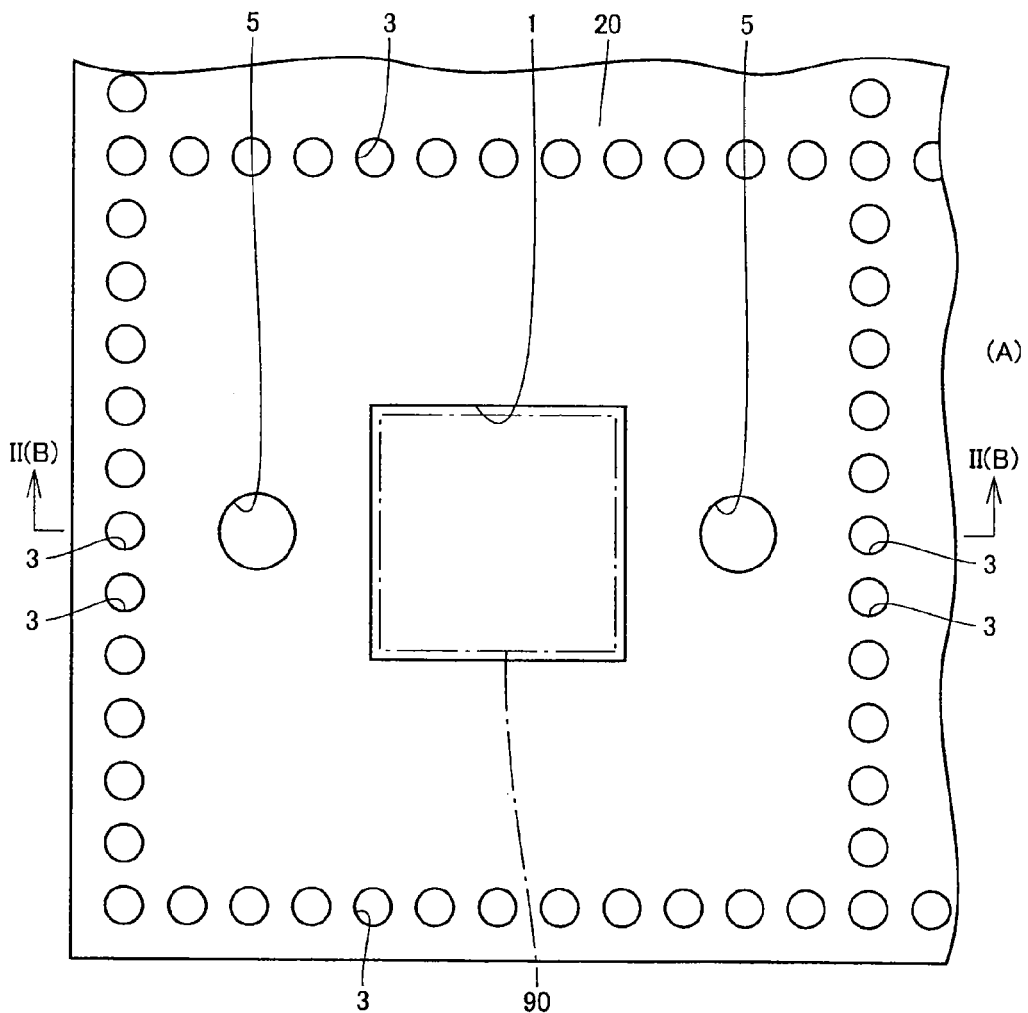
Figure 2:
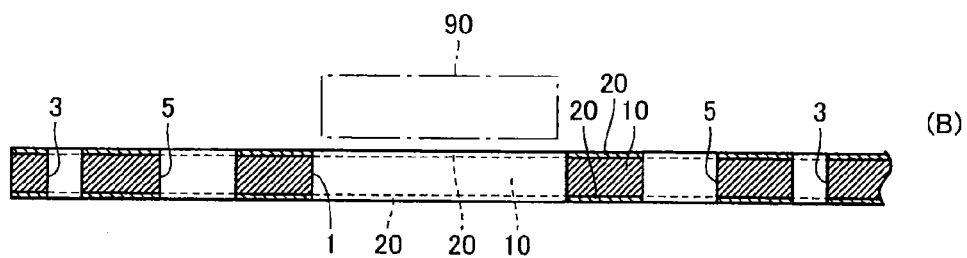
Figure 3:
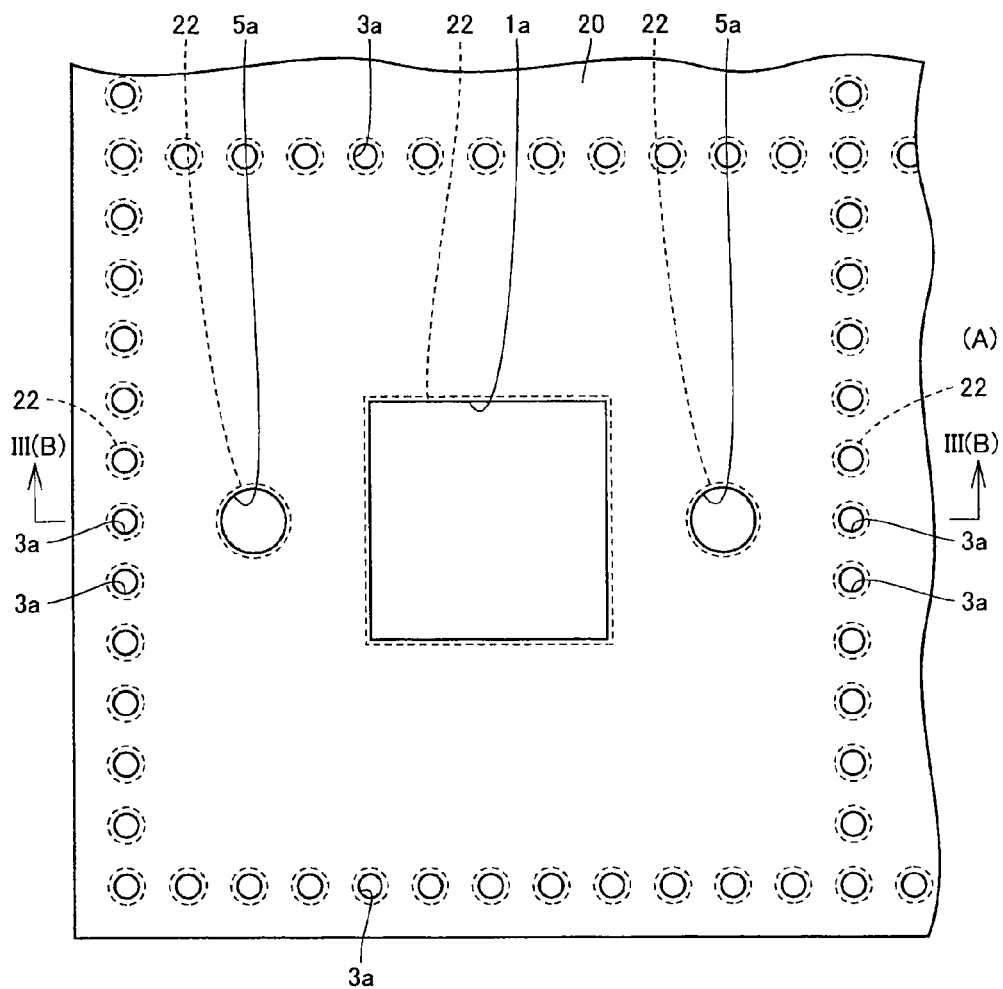
Figure 3:
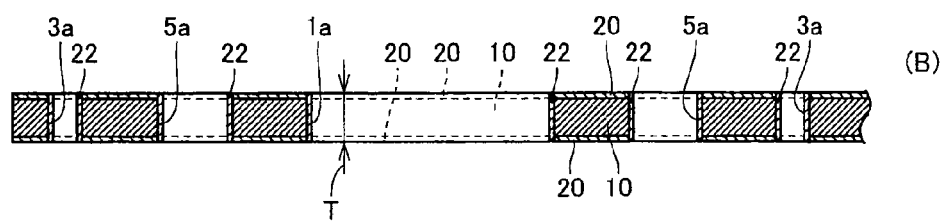

Hereinafter, a method of manufacturing a printed wiring board, and the printed wiring board in an embodiment in accordance with the present invention will be described with reference to the drawings. For convenience of illustration, FIGS. 1 to 24 may include a part which is drawn not to scale. When a number, amount, or the like is referred to in the embodiment described below, the scope of the present invention is not necessarily limited to such a number, amount, or the like, unless otherwise specified. In the embodiment described below, identical or corresponding parts will be designated by the same reference numerals, and the same description may not be repeated.

(Laminated Body 100)

A method of manufacturing a printed wiring board will be described with reference to FIGS. 1 to 10. Firstly, steps of manufacturing a laminated body 100 (see FIG. 10(A)) will be described. Specifically, referring to FIGS. 1(A) and 1(B), a core containing a CFRP (carbon fiber reinforced plastic) (hereinafter also referred to as a CFRP core 10) is prepared. CFRP core 10 has a predetermined size. CFRP core 10 is a composite material made of carbon fiber and a resin.

Content rates of the carbon fiber and the resin constituting CFRP core 10 are not particularly limited. The structure (an unidirectional material, a cross material, or the like) of the carbon fiber constituting CFRP core 10 is not particularly limited. The resin constituting CFRP core 10 is, for example, epoxy, polyimide, bismaleimide, cyanate ester, or the like. Copper foils 20 are respectively bonded to a front surface and a back surface of CFRP core 10.

Referring to FIGS. 2(A) and 2(B), a through hole 1, a plurality of through holes 3, and a plurality of through holes 5 are formed. Each of through holes 1, 3, and 5 penetrates CFRP core 10 and copper foils 20 from a front surface side to a back surface side. By forming each of through holes 1, 3, and 5, CFRP core 10 is exposed at an inner peripheral surface of each of through holes 1, 3, and 5.

Referring to FIG. 2(A), a region surrounded by the plurality of through holes 3 (and a plurality of through holes 4 (see FIG. 16(A))) in a substantially rectangular shape defines the size (outer edge) of the printed wiring board (the details will be described later). One printed wiring board is obtained from the region surrounded by the plurality of through holes 3 (and the plurality of through holes 4). Preferably, the plurality of through holes 3 are disposed in accordance with a desired size as a printed wiring board.

In the printed wiring board obtained by the method of manufacturing a printed wiring board, a predetermined component 90 is to be mounted above or below a region in which through hole 1 is formed (see FIG. 2(B)). A surface on which predetermined component 90 is to be arranged above or below the region serves as a mounting surface. When viewed in a plan view, through hole 1 includes a region in which component 90 is to be mounted. Preferably, the size of through hole 1 is set in accordance with the size of component 90 (for example, 3 cm×3 cm). Preferably, the position of through hole 1 is set in accordance with the position where component 90 is to be mounted. Through holes 5 are provided to form a penetrating through hole 5c1 (see FIG. 21) and a short-circuit through hole 5c2 (see FIG. 21) described later.

Referring to FIGS. 3(A) and 3(B), plating 22 such as copper plating is formed so as to cover each inner peripheral surface of each of through holes 1, 3, and 5. CFRP core 10 exposed at the inner peripheral surface of each of through holes 1, 3, and 5 is covered with plating 22. This prevents falling off of carbon powder from CFRP 10. By plating 22, a through hole 1a is formed inside through hole 1. Similarly, a through hole 3a is formed inside through hole 3, and a through hole 5a is formed inside through hole 5.

Figure 4:
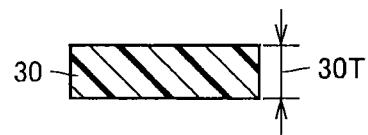
FIG. 4 is a view showing a fourth step of the method of manufacturing the printed wiring board in the embodiment, and is a first cross sectional view showing how to prepare a GFRP core.
Figure 5:
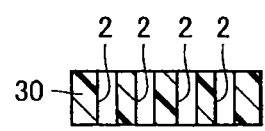
FIG. 5 is a view showing a fifth step of the method of manufacturing the printed wiring board in the embodiment, and is a second cross sectional view showing how to prepare the GFRP core.
Figure 6:
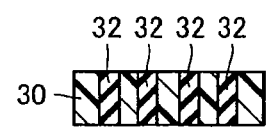
FIG. 6 is a view showing a sixth step of the method of manufacturing the printed wiring board in the embodiment, and is a third cross sectional view showing how to prepare the GFRP core.
Figure 7:
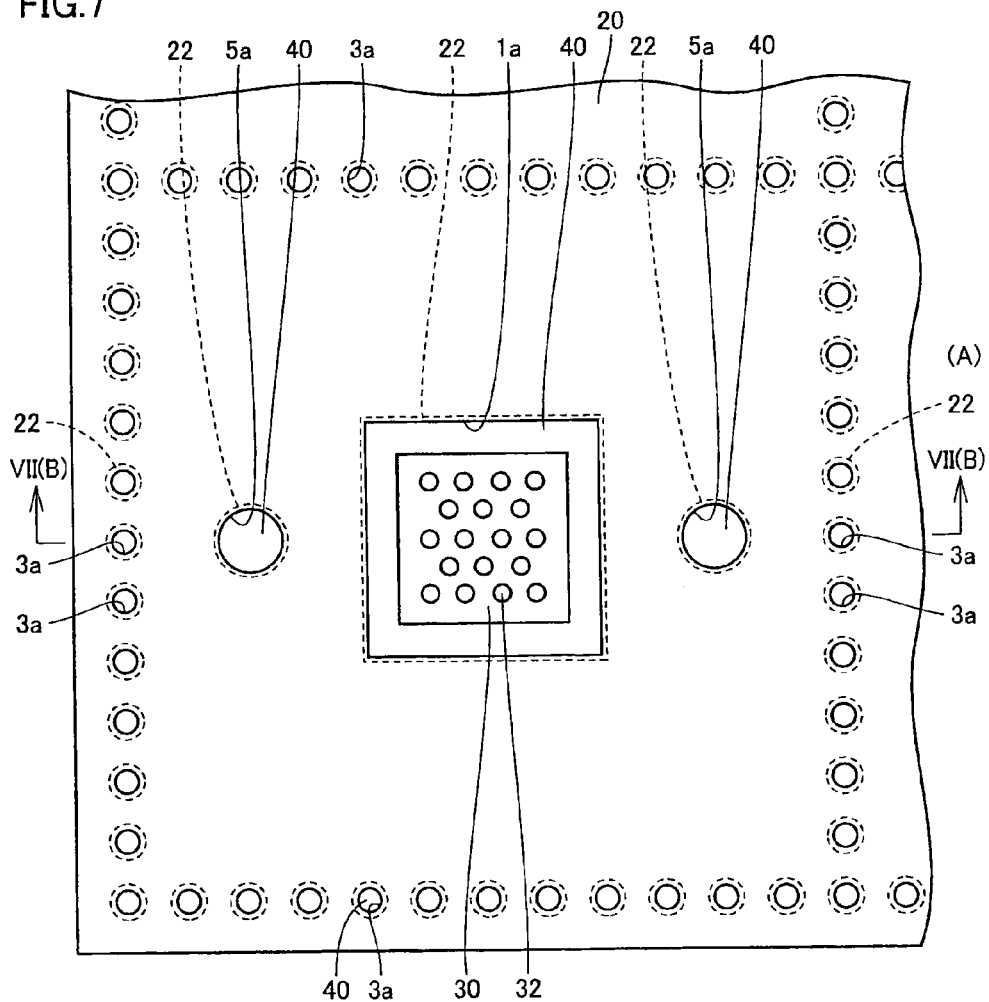
Figure 7:
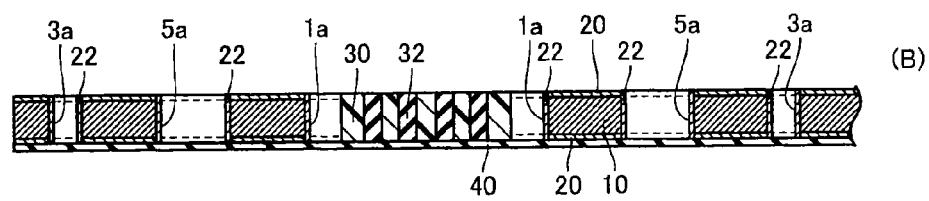

Referring to FIGS. 4 to 6, a core containing a fiber reinforced plastic having insulating properties is prepared. Referring to FIG. 4, in the present embodiment, a core containing a glass fiber reinforced plastic (hereinafter also referred to as a GFRP core 30) is prepared. GFRP core 30 is a composite material made of glass cloth and a resin. The resin constituting GFRP core 30 is, for example, epoxy, polyimide, bismaleimide, cyanate ester, or the like.

The size of GFRP core 30 when viewed in a plan view is set to be smaller than that of through hole 1a (see FIG. 3(A)). The size of GFRP core 30 when viewed in a plan view is set such that a gap between through hole 1a and the GFRP is, for example, 0.3 mm. Preferably, a thickness 30T of GFRP core 30 (see FIG. 4) is substantially identical to a combined thickness T of CFRP core 10 and copper foils 20 (see FIG. 3(B)).

Referring to FIG. 5, when GFRP core 30 is prepared, it is preferable to form a plurality of through holes 2 penetrating from a front surface side to a back surface side of GFRP core 30.

Referring to FIG. 6, when through holes 2 are formed, the plurality of through holes 2 are filled with a predetermined resin (resin paste) by a printing method using a vacuum coater. By curing the resin paste, a resin 32 having insulating properties is formed inside each of the plurality of through holes 2.

Resin 32 contains a resin such as epoxy, polyimide, bismaleimide, or cyanate ester, and an inorganic filler. Preferably, resin 32 contains an epoxy resin and silica.

Since resin 32 contains an inorganic filler, an elastic modulus of GFRP core 30 in a planar direction can be decreased. Since resin 32 contains an inorganic filler, a stress caused by a difference in thermal expansion coefficient between GFRP core 30 and CFRP core 10 into which GFRP core 30 is to be embedded (the details will be described below) is relieved. From the viewpoint of relieving the stress, resin 32 preferably has a thermal expansion coefficient of about 30 ppm/K.

After resin 32 is formed, resin 32 adhering to an unnecessary portion (for example, a front surface of GFRP core 30) is polished. An unnecessary portion of resin 32 is removed.

Referring to FIGS. 7(A) and 7(B), next, a predetermined film 40 is attached to the back surface side of CFRP core 10 having through holes 1a, 3a, and 5a formed therein. Film 40 is, for example, polyethylene terephthalate having an adhesive material applied thereto. After film 40 is attached, GFRP core 30 having through holes 2 each filled with resin 32 is placed on film 40, from the front surface side of CFRP core 10, so as to be included in through hole 1a. Preferably, the front surface of GFRP core 30 is flush with copper foil 20 attached to the front surface side of GFRP core 30. After film 40 is attached, GFRP core 30 not filled with resin 32 (see FIG. 4) may be placed on film 40, from the front surface side of CFRP core 10, so as to be included in through hole 1a.

Figure 8:
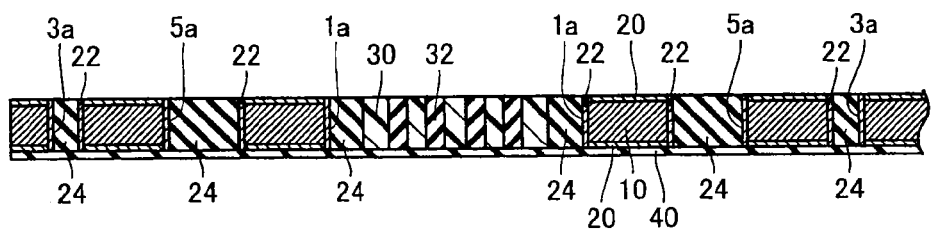
FIG. 8 is a cross sectional view showing an eighth step of the method of manufacturing the printed wiring board in the embodiment.

Referring to FIG. 8, through hole 1a (the gap between through hole 1a and GFRP core 30), through holes 3a, and through holes 5a are filled with a predetermined resin (resin paste) by the printing method using the vacuum coater.

By curing the resin paste, a resin 24 having insulating properties is formed inside each of through hole 1a (the gap between through hole 1a and GFRP core 30), through holes 3a, and through holes 5a. Resin 24 contains a resin such as epoxy, polyimide, bismaleimide, or cyanate ester, and an inorganic filler. Preferably, resin 24 contains an epoxy resin and silica.

When resin 24 contains silica, through holes 4 (see FIG. 16(A)) described later and through holes 5b (see FIG. 20) described later can be readily formed by using a drill or the like. When resin 24 contains silica, a stress caused between resin 24 and plating 68 (see FIG. 21) formed in penetrating through hole 5c1 (see FIG. 20) described later is relieved. From the viewpoint of relieving the stress, resin 24 preferably has a thermal expansion coefficient of about 30 ppm/K.

Preferably, each of resin 24 and above resin 32 has an elasticity lower than that of the core containing a fiber reinforced plastic having insulating properties prepared for example as GFRP core 30. Further, preferably, each of resin 24 and above resin 32 has an elasticity lower than those of an insulating layer 52 (see FIG. 11) described later and a prepreg 62 (see FIG. 14) described later.

CFRP core 10 has an in-plane elastic modulus of about 205 GPa. GFRP core 30 as an example of the core containing a fiber reinforced plastic having insulating properties has an in-plane elastic modulus of about 38 GPa. Copper has an elastic modulus of about 129 GPa. When each of resins 24, 32 has an elastic modulus of, for example, about 5 GPa, the elastic modulus is decreased, although the thermal expansion coefficient is increased. A stress as a whole can be reduced.

GFRP core 30 is embedded in through hole 1 (through hole 1a) using resin 24. Resin 24 adhering to an unnecessary portion (for example, the front surface of GFRP core 30) is polished. An unnecessary portion of resin 24 is removed.

Figure 9:
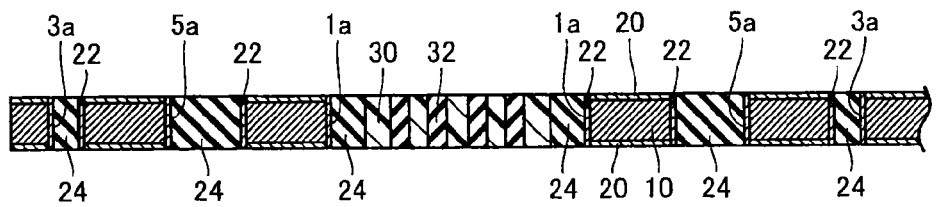
FIG. 9 is a cross sectional view showing a ninth step of the method of manufacturing the printed wiring board in the embodiment.
Figure 10:
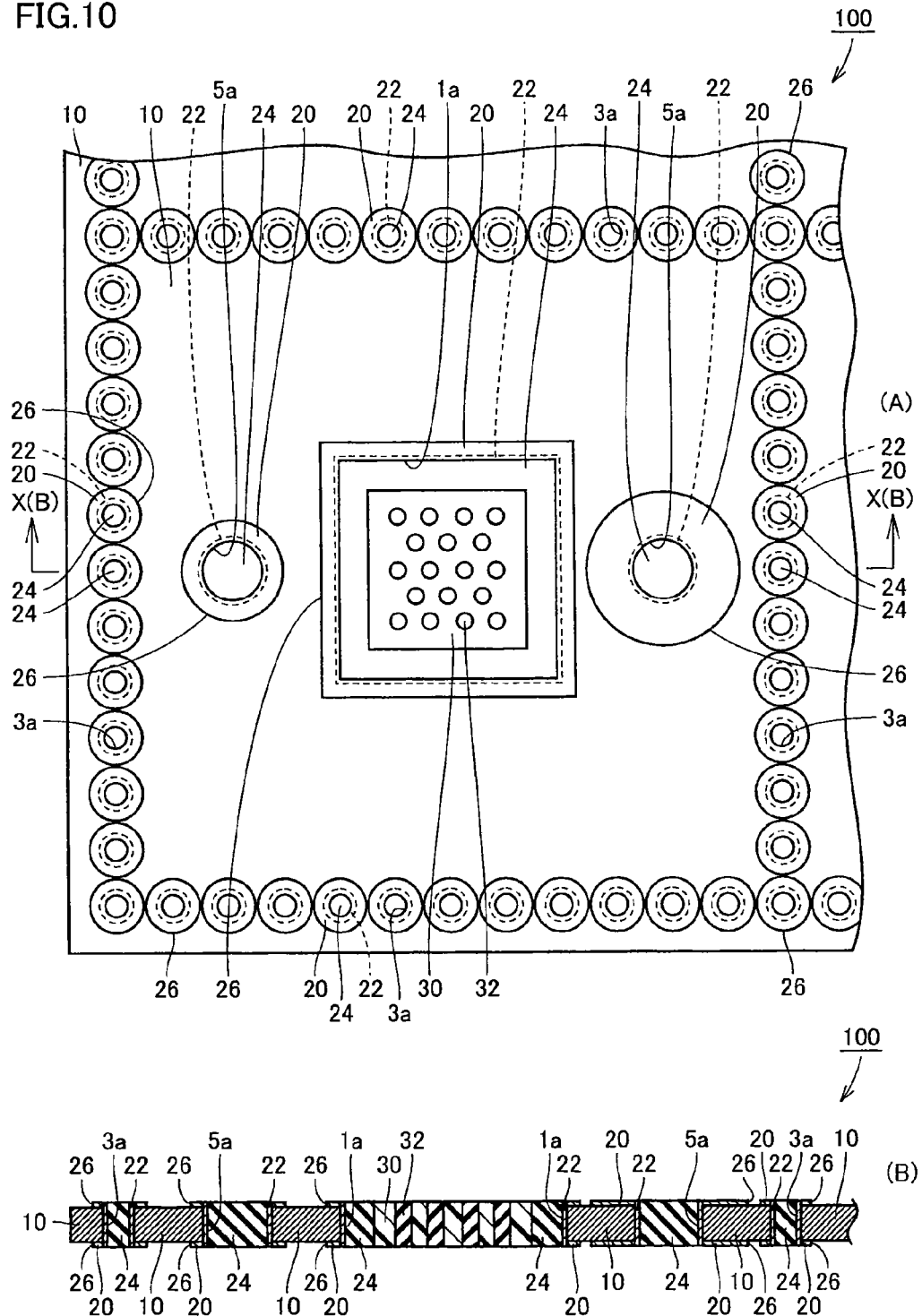
Figure 11:
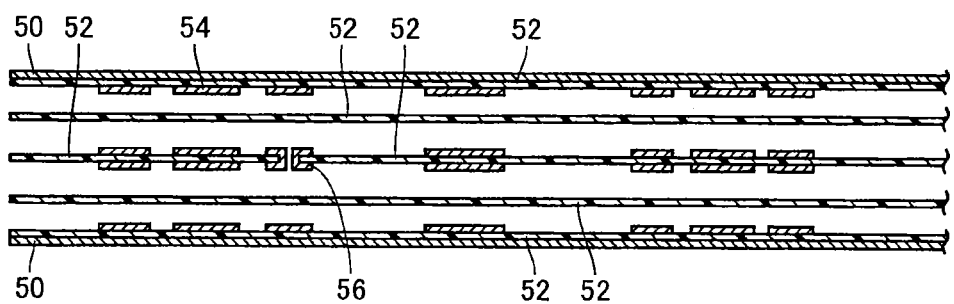
FIG. 11 is a view showing an eleventh step of the method of manufacturing the printed wiring board in the embodiment, and is a first cross sectional view showing how to prepare an inner layer core.

Referring to FIG. 9, film 40 is removed. Referring to FIGS. 10(A) and 10(B), patterning is performed on copper foils 20 on the front surface side and the back surface side so as to leave only copper foil 20 around each of through holes 1a, 3a, and 5a. Patterns 26 (copper wirings) are formed in portions subjected to the patterning, and CFRP core 10 is exposed in portions other than patterns 26.

Since copper foils 20 are removed in the portions subjected to the patterning, a stress caused between CFRP core 10 and plating 22 is relieved. Further, laminated body 100 has a lighter mass. Thus, laminated body 100 is obtained. By performing the steps described above with reference to FIGS. 1 to 10, it is possible to obtain a method of manufacturing a printed wiring board in which a mounted component is not affected by a stray capacitance due to a CFRP, and in which it is not difficult to form a circuit.

(Inner Layer Core 200)

Steps of preparing an inner layer core 200 (see FIG. 13), aside from laminated body 100 described above, will be described with reference to FIGS. 11 to 13. Specifically, referring to FIG. 11, copper foils 50 and insulating layers 52 containing a GFRP are laminated. On front surfaces (or back surfaces) of insulating layers 52, inner layer copper wirings 54 and an inner layer connection 56 (also referred to as a Blind Via Hole: BVH) are formed as inner layer patterns, through predetermined etching or the like. Insulating layer 52 is a composite material made of glass cloth and a resin. The resin constituting insulating layer 52 is, for example, epoxy, polyimide, bismaleimide, cyanate ester, or the like.

Figure 12:
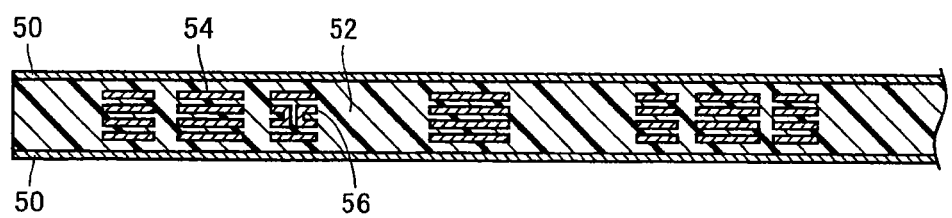
FIG. 12 is a view showing a twelfth step of the method of manufacturing the printed wiring board in the embodiment, and is a second cross sectional view showing how to prepare the inner layer core.

Referring to FIG. 12, after copper foils 50, insulating layers 52, inner layer copper wirings 54, and inner layer connection 56 are laminated, they are pressurized under vacuum at a high temperature. Copper foils 50, insulating layers 52, inner layer copper wirings 54, and inner layer connection 56 are integrated as a molded item.

Figure 13:
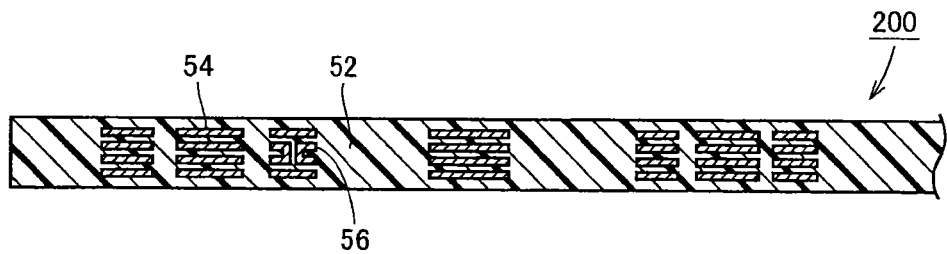
FIG. 13 is a view showing a thirteenth step of the method of manufacturing the printed wiring board in the embodiment, and is a third cross sectional view showing how to prepare the inner layer core.

Referring to FIG. 13, copper foils 50 on a front surface side and a back surface side are removed by etching. Insulating layer 52 is exposed on the front surface side and the back surface side. Insulating layer 52 has flat front and back surfaces.

After inner layer core 200 and above laminated bodies 100 are laminated as described below, they are pressurized under vacuum at a high temperature. Since inner layer core 200 (insulating layer 52) has flat front and back surfaces, there is no step difference in the vicinity of inner layer copper wirings 54 even if a high pressure is applied during pressurization. Buckling of CFRP core 10 during pressurization can be prevented. Thus, inner layer core 200 is obtained. Inner layer core 200 has an in-plane thermal expansion coefficient of about 16 ppm/K, and an out-of-plane thermal expansion coefficient of about 60 ppm/K.

(Laminated Body 300)

Figure 14:
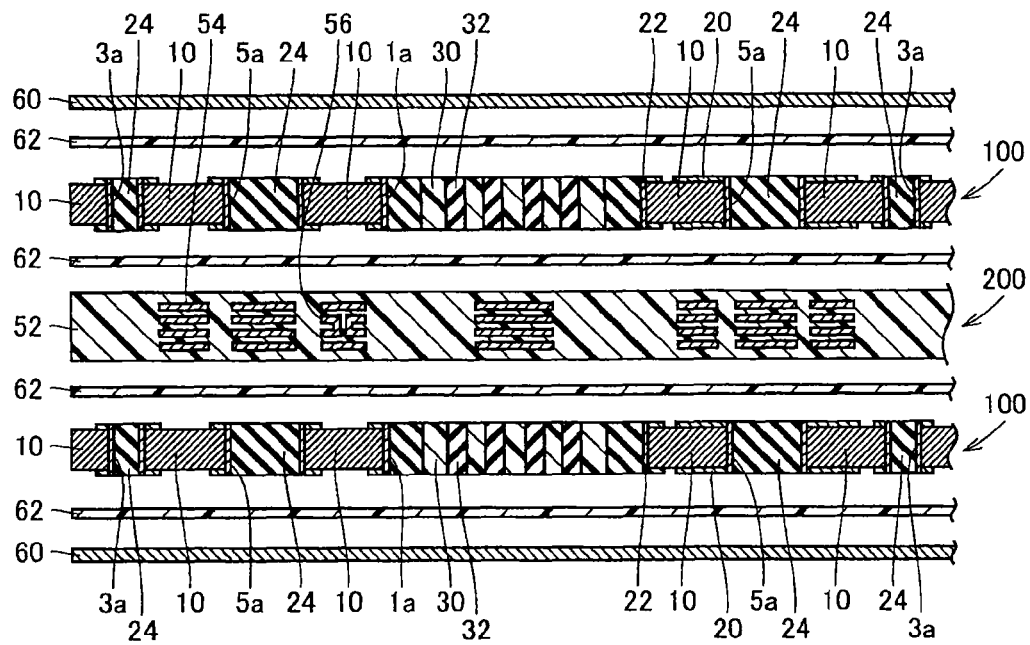
FIG. 14 is a cross sectional view showing a fourteenth step of the method of manufacturing the printed wiring board in the embodiment.

Referring to FIG. 14, copper foils 60 (conductor layers), prepregs 62 containing a GFRP, laminated bodies 100, and inner layer core 200 are laminated. In the present embodiment, two laminated bodies 100 are laminated so as to sandwich inner layer core 200 from upper and lower directions in the paper plane. Prepreg 62 has an in-plane thermal expansion coefficient of about 16 ppm/K, and an out-of-plane thermal expansion coefficient of about 60 ppm/K. Prepreg 62 is a composite material made of glass cloth and a resin. The resin constituting prepreg 62 is, for example, epoxy, polyimide, bismaleimide, cyanate ester, or the like.

Figure 15:
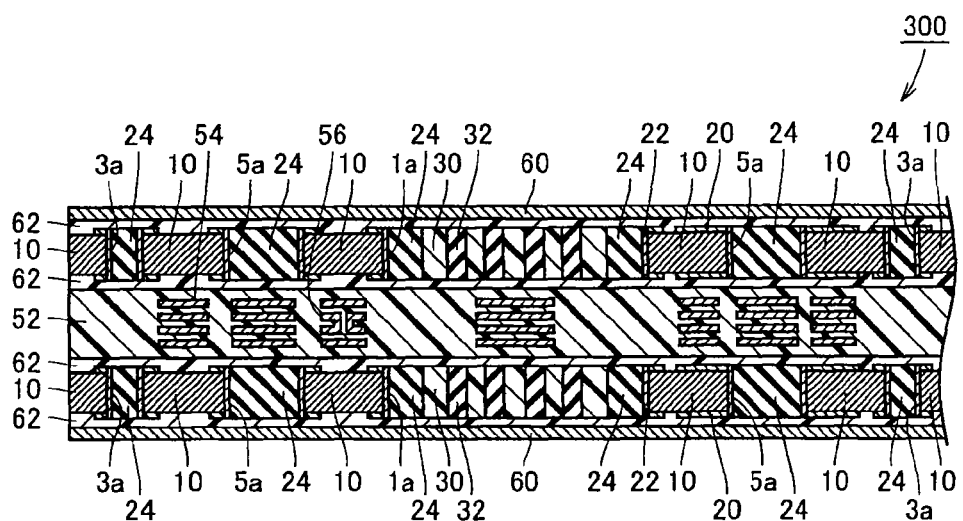
FIG. 15 is a cross sectional view showing a fifteenth step of the method of manufacturing the printed wiring board in the embodiment.
Figure 16:
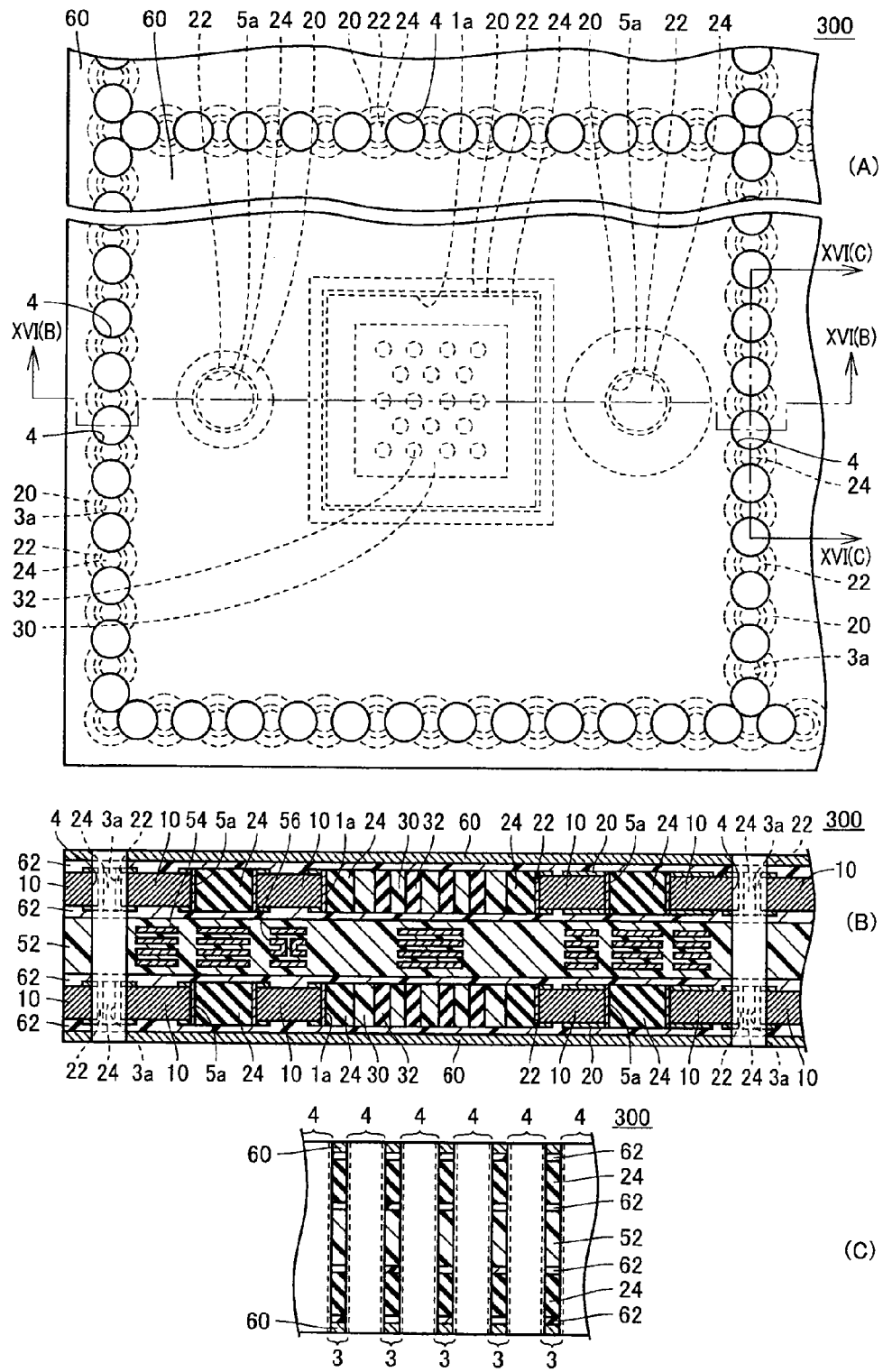

Referring to FIG. 15, after copper foils 60, prepregs 62, laminated bodies 100, and inner layer core 200 are laminated, they are pressurized under vacuum at a high temperature. Copper foils 60, prepregs 62, laminated bodies 100, and inner layer core 200 are integrated as a molded item. Thus, a laminated body 300 is obtained.

(Outer Edge Processing)

Referring to FIGS. 16(A), 16(B), and 16(C), through holes 4 are formed so as to penetrate laminated body 300. Through holes 4 are formed such that, when viewed in a plan view, through hole 4 partially overlaps through hole 3. Preferably, through holes 4 are formed such that, when viewed in a plan view, through hole 4 partially overlaps through hole 3a located inside through hole 3. Copper plating may be applied to an inner peripheral surface of through hole 4.

Figure 17:
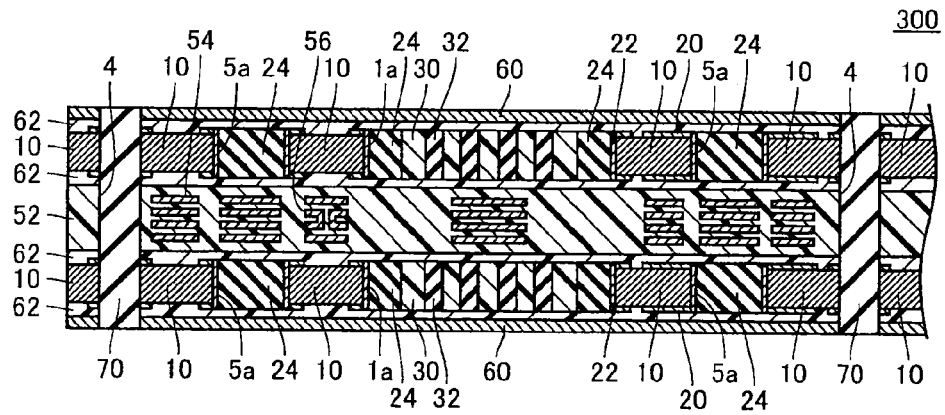
FIG. 17 is a cross sectional view showing a seventeenth step of the method of manufacturing the printed wiring board in the embodiment.

Referring to FIG. 17, through holes 4 are filled with a predetermined resin (resin paste) by the printing method using the vacuum coater. When they are filled with the resin paste, it is preferable to use a predetermined film, as described above (see FIG. 7(B)).

By curing the resin paste, a resin 70 having insulating properties is formed inside each of through holes 4. Resin 70 contains a resin such as epoxy, polyimide, bismaleimide, or cyanate ester, and an inorganic filler. After resin 70 is formed, resin 70 adhering to an unnecessary portion (for example, a front surface of copper foil 60) is polished. An unnecessary portion of resin 70 is removed.

Figure 18:
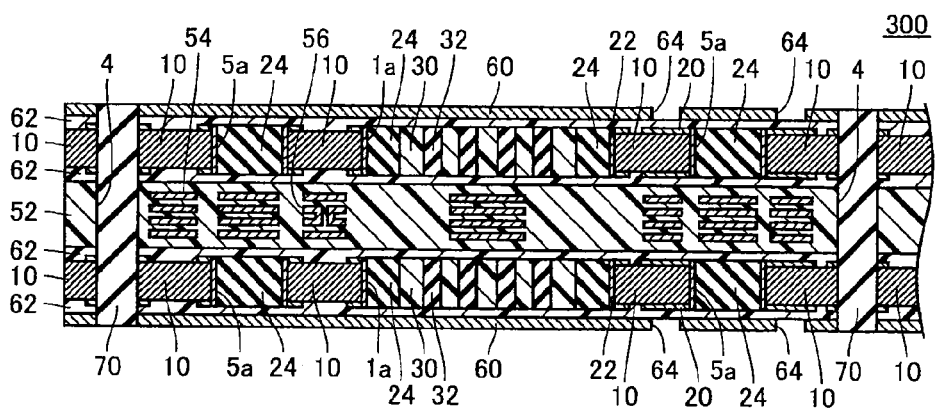
FIG. 18 is a cross sectional view showing an eighteenth step of the method of manufacturing the printed wiring board in the embodiment.

Referring to FIG. 18, patterning is performed on a portion of copper foils 60 on a front surface side and a back surface side to form vias (vias 65, see FIG. 22(A)). Openings 64 are formed in portions subjected to the patterning. In the present embodiment (see FIG. 22(A)), patterning is performed on copper foil 60 at six locations around through hole 5a on the right side in the paper plane (when viewed in a plan view). Cured prepreg 62 is exposed in the portions subjected to the patterning at the six locations.

Figure 19:
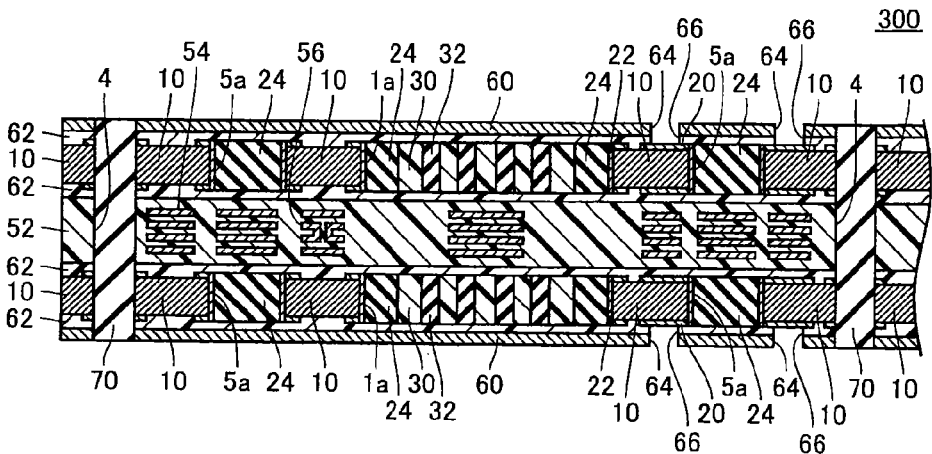
FIG. 19 is a cross sectional view showing a nineteenth step of the method of manufacturing the printed wiring board in the embodiment.

Referring to FIG. 19, laser is emitted to exposed prepregs 62. Openings 66 are formed in portions to which laser beams are emitted. In the portions where openings 66 are formed, copper foils 20 bonded to CFRP cores 10 are partially exposed.

Figure 20:
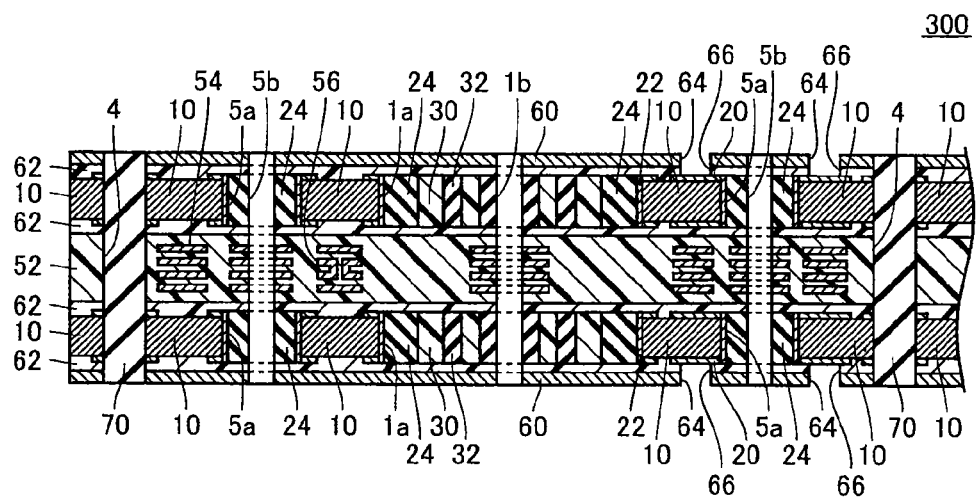
FIG. 20 is a cross sectional view showing a twentieth step of the method of manufacturing the printed wiring board in the embodiment.

Referring to FIG. 20, a through hole 1b and through holes 5b are formed so as to penetrate laminated body 300. When viewed in a plan view, through hole 1b is included in through hole 1a. When viewed in a plan view, through hole 5b is included in through hole 5a.

Figure 21:
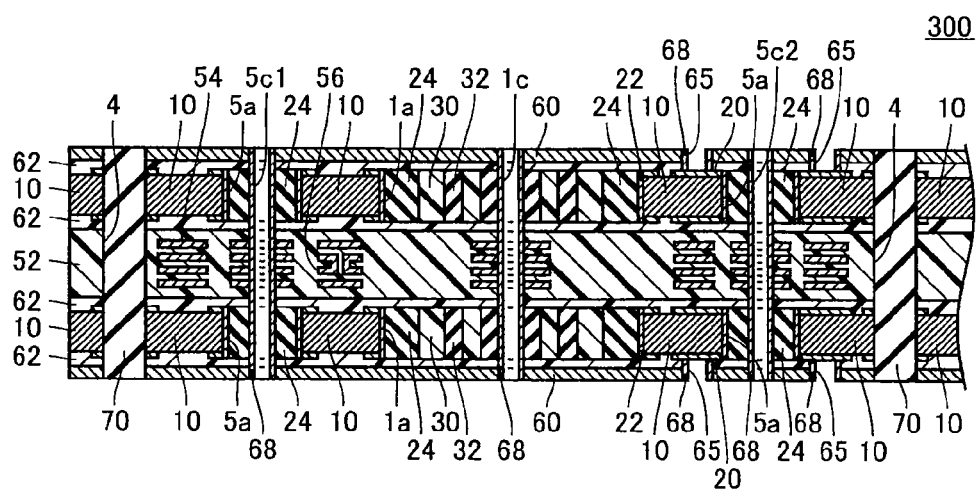
FIG. 21 is a cross sectional view showing a twenty-first step of the method of manufacturing the printed wiring board in the embodiment.
Figure 22:
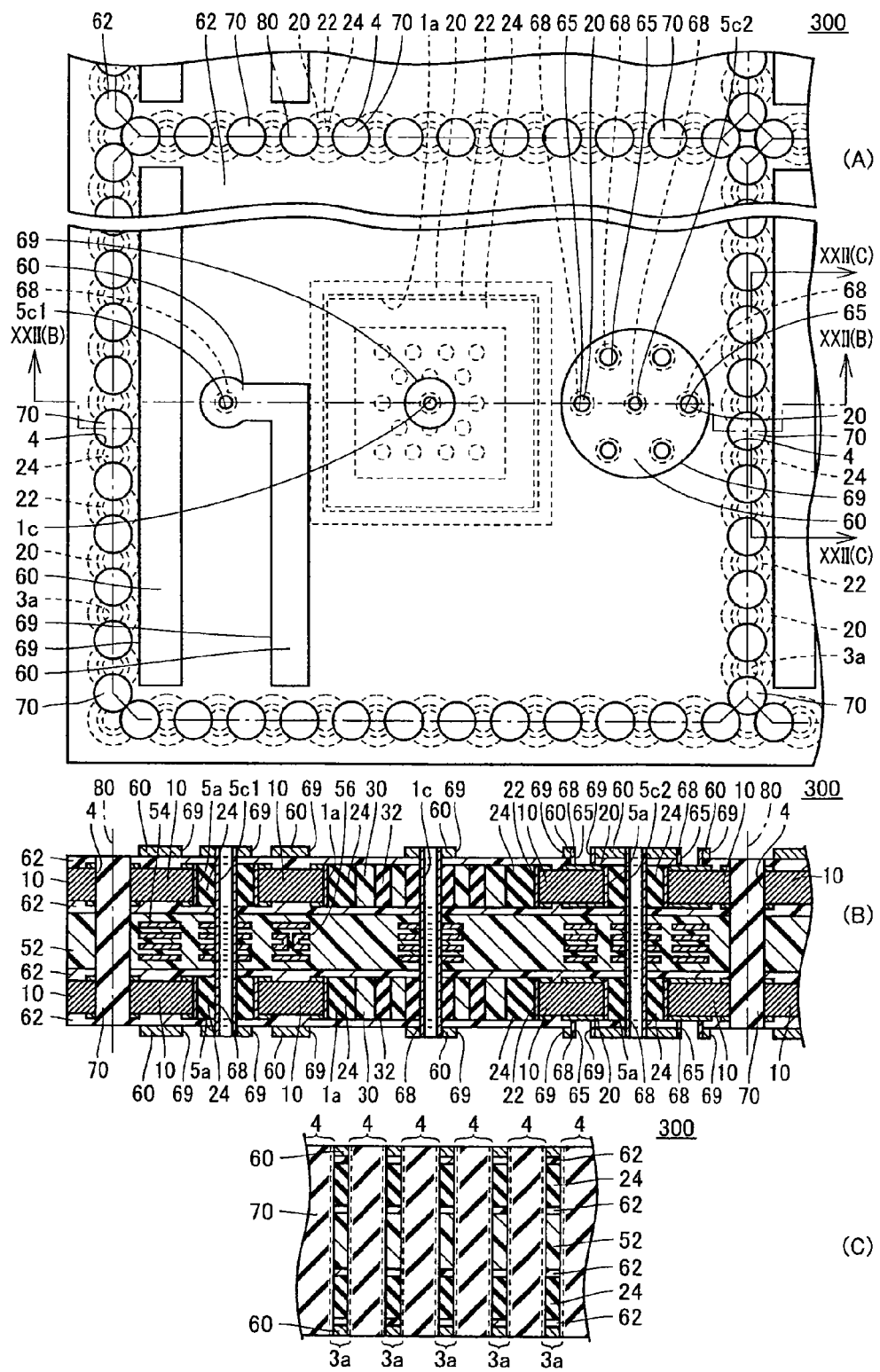
Figure 23:
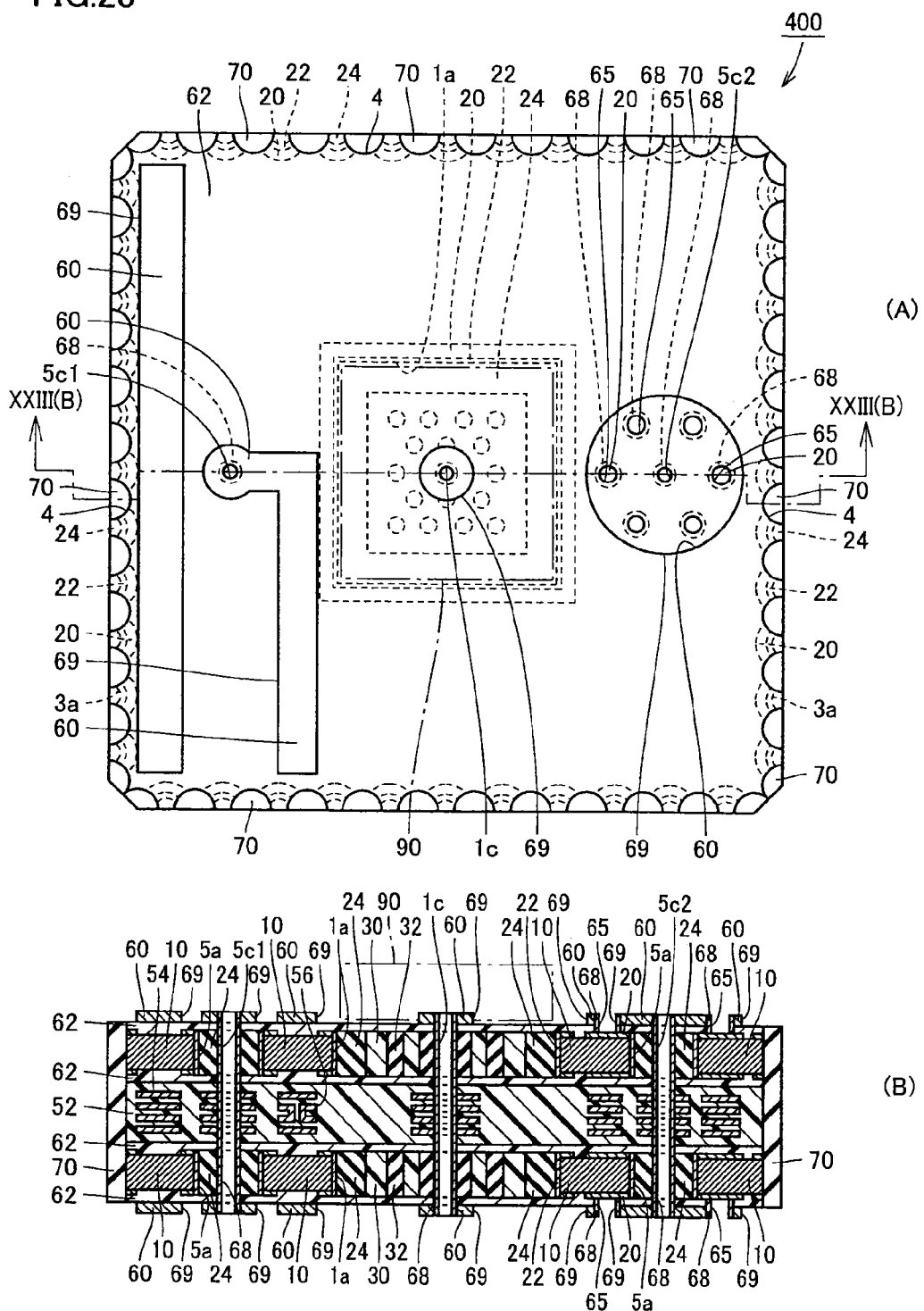

Referring to FIG. 21, plating 68 such as copper plating is formed so as to cover each inner peripheral surface of each of through holes 1b, 5b and openings 64, 66. Via 65 (laser via) is formed inside openings 64, 66. Via 65 has an inner diameter of, for example, 100 μm. A penetrating through hole 1c is formed inside through hole 1b. Penetrating through hole 1c has an inner diameter of, for example, 0.3 mm. Preferably, when viewed in a plan view, penetrating through hole 1c is included in GFRP core 30. In other words, preferably, penetrating through hole 1c is formed so as to penetrate GFRP cores 30. With such a configuration, a signal line (penetrating through hole) having a pitch narrower than that of penetrating through hole 5c1 (the details will be described below) provided in CFRP cores 10 can be provided.

Similarly, penetrating through hole 5c1 is formed inside one through hole 5b (on the left side in the paper plane). Penetrating through hole 5c1 has an inner diameter of, for example, 0.3 mm. Penetrating through hole 5c1 is insulated from CFRP cores 10. Short-circuit through hole 5c2 is formed inside the other through hole 5b (on the right side in the paper plane). Short-circuit through hole 5c2 has an inner diameter of, for example, 0.3 mm. Short-circuit through hole 5c2 is in conduction with each CFRP core 10 through copper foil 60, via 65, and copper foil 20.

Since CFRP core 10 is connected to copper foil 60 (conductor layer) through via 65, there is no need to immerse the laminated body having CFRP cores 10 and copper foils 60 laminated therein into a plating bath to form a via. Contamination of the plating bath due to carbon powder can be suppressed. It is also possible to form short-circuit through hole 5c2 by opening a through hole in CFRP cores 10 and thereafter directly performing plating treatment on the through hole, although there is a possibility that carbon powder may enter the plating bath during the plating treatment.

Referring to FIGS. 22(A), 22(B), and 22(C), patterning is performed on copper foils 60 on the front surface side and the back surface side so as to form predetermined copper wirings 69. Cured prepregs 62 are exposed in portions subjected to the patterning.

Next, router processing is performed along an outer shape processing line 80 (corresponding to the outer edge of the printed wiring board). Outer shape processing line 80 is defined so as to follow insulating resin 24 formed inside each through hole 3a and insulating resin 70 formed inside each through hole 4. Even if laminated body 300 is cut along outer shape processing line 80, CFRP cores 10 are not exposed in a cut portion (the outer edge of the printed wiring board). In the portion, only insulating resin 24 and insulating resin 70 are exposed.

Even if a plurality of printed wiring boards 400 are formed from one laminated body 300, no carbon powder is scattered from an outer edge of each printed wiring board 400, suppressing a short circuit in a fine wiring and the like on a circuit.

Referring to FIGS. 23(A) and 23(B), subsequently, predetermined solder resist processing, predetermined solder leveler treatment, and the like are performed. Thus, printed wiring board 400 is obtained.

Predetermined component 90 is to be mounted on printed wiring board 400. Component 90 is to be mounted above GFRP cores 30 embedded in through holes 1. Both GFRP core 30 and resin 24 formed inside through hole 1 have insulating properties. In other words, there is no CFRP core 10 having conductivity below a region in which component 90 is to be mounted.

Even if component 90 is mounted on printed wiring board 400, component 90 is not affected by a stray capacitance due to CFRP core 10. GFRP core 30 is embedded inside through hole 1 formed in CFRP core 10. Since printed wiring board 400 does not have an uneven front surface, it is not difficult to form a circuit on the front surface of printed wiring board 400.

(Another Configuration of Embodiment)

Figure 24:
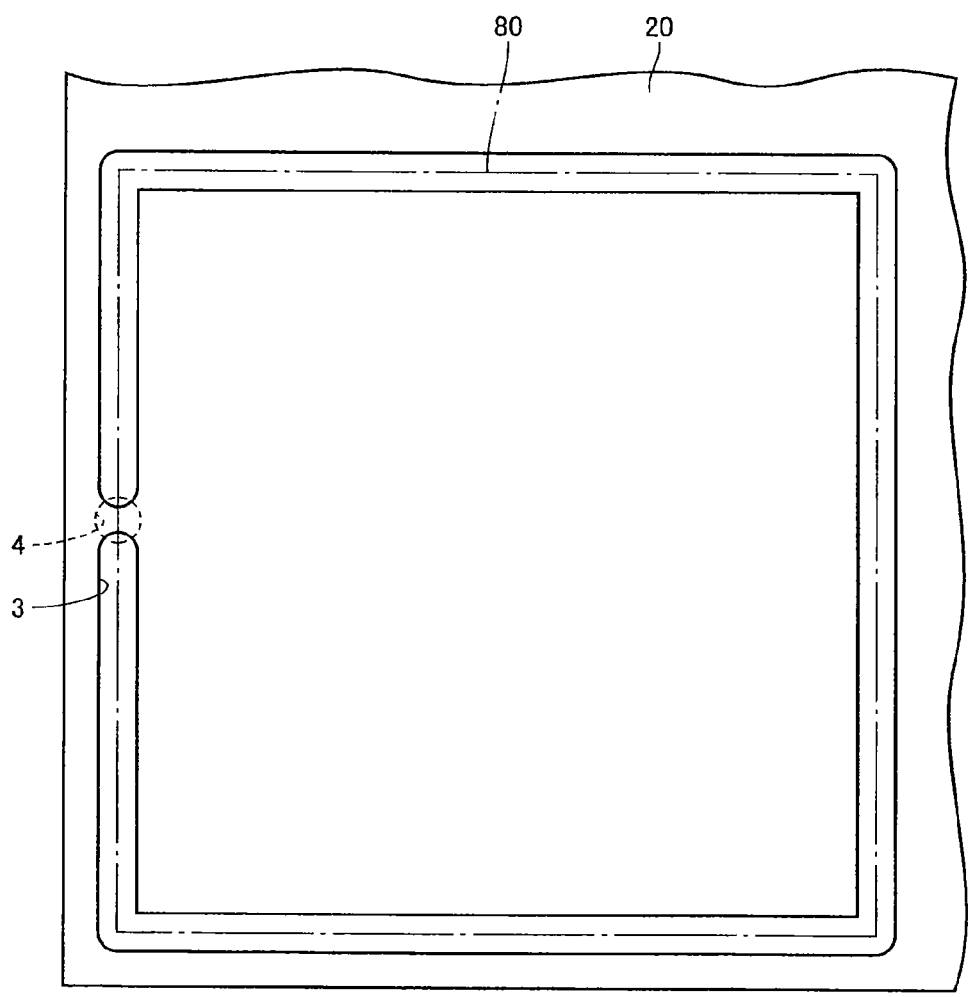
FIG. 24 is a plan view showing a method of manufacturing a printed wiring board in another configuration of the embodiment.

Although the plurality of through holes 3 (see FIG. 2(A)) are formed in the above embodiment, the present invention is not limited thereto. Referring to FIG. 24, one through hole 3 may be provided. When one through hole 3 is provided, through hole 3 is formed as a long hole. It is to be noted that plating 22 such as copper plating may also be formed on an inner peripheral surface of through hole 3 formed as a long hole, as described with reference to FIG. 3.

When one through hole 3 is provided, through hole 4 (see FIG. 16(A)) is formed between one end and the other end of through hole 3 when viewed in a plan view. Through hole 4 partially overlaps through hole 3. Outer shape processing line 80 is defined so as to follow only an insulating resin (resin 24) formed inside through hole 3 and an insulating resin (resin 70) formed inside through hole 4.

Even if router processing is performed along outer shape processing line 80, the CFRP core is not exposed at the outer edge of the printed wiring board. No carbon powder is scattered from the outer edge, suppressing a short circuit in a fine wiring and the like on a circuit.

Although the above embodiment has been described based on a method of manufacturing a six-layer printed wiring board, and the six-layer printed wiring board, the present invention is not limited thereto. The present invention can also be used for a method of manufacturing a printed wiring board having a desired number of layers by changing the number of layers in inner layer core 200 (see FIG. 13), and the printed wiring board.

Although the embodiment for carrying out the invention in accordance with the present invention has been described above, it should be understood that the embodiment disclosed herein is illustrative and non-restrictive in every respect. The scope of the present invention is defined by the scope of the claims, and is intended to include any modifications within the scope and meaning equivalent to the scope of the claims.

INDUSTRIAL APPLICABILITY

The present invention is particularly advantageously applicable to a method of manufacturing a printed wiring board having a core containing a CFRP, and the printed wiring board.

REFERENCE SIGNS LIST

1, 1a, 1b, 2, 3, 3a, 4, 5, 5a, 5b: through hole, 1c, 5c1: penetrating through hole, 5c2: short-circuit through hole, 10: CFRP core, 20, 50, 60: copper foil, 24, 32, 70: resin, 26: pattern, 30: GFRP core, 40: film, 52: insulating layer, 54: inner layer copper wiring, 56: inner layer connection, 62: prepreg, 64, 66: opening, 65: via, 69: copper wiring, 80: outer shape processing line, 90: component, 100, 300: laminated body, 200: inner layer core, 400: printed wiring board.

The invention claimed is:

1. A method of manufacturing a printed wiring board on which a predetermined component is to be mounted on at least one of a front surface side and a back surface side, comprising:
   preparing a core of the printed wiring board, the core containing a carbon fiber reinforced plastic;
   forming a first through hole in the core so as to penetrate said core from a side of the core that faces said front surface side to a side of the core that faces said back surface side, the first through hole including a region in which said predetermined component is to be mounted when viewed in a plan view;
   preparing a core portion by forming a plurality of second through holes penetrating a fiber reinforced plastic having insulating properties from a front surface side of the fiber reinforced plastic to a back surface side of the fiber reinforced plastic, and filling the plurality of second through holes with a predetermined resin; and
   after preparing said core portion, embedding said prepared core portion having the plurality of second through holes filled with the predetermined resin within said first through hole by
   closing said back surface side of said first through hole,
   arranging said core portion in said first through hole,
   filling said first through hole with a paste-like resin having insulating properties, and
   curing said resin.

2. The method of manufacturing the printed wiring board according to claim 1, wherein said fiber reinforced plastic is a glass fiber reinforced plastic.

3. The method of manufacturing the printed wiring board according to claim 1, further comprising:
   filling said second through hole with the predetermined resin containing an inorganic filler.

4. The method of manufacturing the printed wiring board according to claim 1, wherein
   said core portion is provided with a penetrating through hole so as to penetrate said fiber reinforced plastic, and
   a predetermined signal line is connected to said penetrating through hole.

5. The method of manufacturing the printed wiring board according to claim 1, wherein the plurality of second through holes are only filled entirely within the predetermined resin, and the predetermined resin has insulating properties.

\* \* \* \* \*